United States Patent
Lee (10) Patent No.: US 6,870,409 B2
(45) Date of Patent: Mar. 22, 2005

(54) FREQUENCY SYNTHESIZER FOR REDUCING NOISE

(75) Inventor: Jung-Hyun Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 8 days.

(21) Appl. No.: 10/431,523

(22) Filed: May 8, 2003

(65) Prior Publication Data

US 2003/0227301 A1 Dec. 11, 2003

(30) Foreign Application Priority Data

Jun. 11, 2002 (KR) ........................................ 2002-32600

(51) Int. Cl.[7] .............................................. H03L 7/06
(52) U.S. Cl. ...................... 327/147; 327/156; 327/105
(58) Field of Search ................................ 327/105, 107, 327/147, 156; 377/47, 48; 331/1 A, 10; 455/165.1, 260, 76

(56) References Cited

U.S. PATENT DOCUMENTS

| 4,179,670 | A | | 12/1979 | Kingsbury | .................... 331/10 |
|---|---|---|---|---|---|
| 4,851,787 | A | | 7/1989 | Martin | ........................ 331/1 A |
| 5,305,362 | A | | 4/1994 | Miller | .......................... 377/48 |
| 5,424,687 | A | | 6/1995 | Fukuda | ........................ 331/11 |
| 5,903,194 | A | | 5/1999 | Opsahl et al. | ............... 331/1 A |
| 6,624,705 | B1 | * | 9/2003 | Huard et al. | ..................... 331/16 |
| 6,708,026 | B1 | * | 3/2004 | Klemmer et al. | ........... 455/314 |
| 2002/0145472 | A1 | * | 10/2002 | Oh | .............................. 331/1 A |
| 2002/0163389 | A1 | * | 11/2002 | Jun | .............................. 331/1 A |
| 2003/0109237 | A1 | * | 6/2003 | Chien et al. | ................. 455/260 |
| 2003/0112079 | A1 | * | 6/2003 | Saeki et al. | .................. 331/1 A |
| 2003/0119466 | A1 | * | 6/2003 | Goldman | ..................... 455/260 |
| 2003/0137359 | A1 | * | 7/2003 | Patana | ......................... 331/100 |

FOREIGN PATENT DOCUMENTS

| JP | 9-312567 | 11/1997 |
|---|---|---|
| JP | 10-163866 | 12/1998 |
| KR | 1996-20000 | 6/1996 |
| KR | 1999-0074953 | 10/1999 |

OTHER PUBLICATIONS

Rhee et al., A 1.1–GHz CMOS Fractional–N Frequency Synthesizer with a 3–b Third–Order Modulator, IEEE Journal of Solid–State Circuits, vol. 35, No. 10, Oct. 2000, pp. 1453–1460.

Riley et al., Delta–Sigma Modulation in Fractional–N Frequency Synthesis, IEEE Journal of Solid–State Circuits, vol. 28, No. 5, May 1993, pp. 553–559.

* cited by examiner

*Primary Examiner*—Tuan T. Lam

(57) ABSTRACT

A fractional-N frequency synthesizer includes a first divider, a second divider, and a division ratio controller. The first divider receives and divides an oscillation frequency signal. The second divider receives a predetermined feedback frequency signal and divides the feedback frequency signal in response to a selection signal. The division ratio controller receives and divides an output signal of the first divider and an output signal of the second divider and generates a reference frequency signal in which the oscillation frequency signal is divided, a comparison frequency signal that is compared with the reference frequency signal, and the selection signal used to select the division ratio of the second divider.

24 Claims, 7 Drawing Sheets

FREQUENCY SYNTHESIZER FOR REDUCING NOISE

This application claims priority under 35 U.S.C. § 119 from Korean Patent Application No. 2002-32600, filed on Jun. 11, 2002, the contents of which are hereby incorporated by reference in their entirety for all purposes as if fully set forth herein.

BACKGROUND AND SUMMARY

1. Technical Field

The present invention relates to a frequency synthesizer for reducing noise, and more particularly, to a phase locked loop (PLL)-based fractional-N frequency synthesizer.

2. Description

Recently, frequency synthesizers use a fractional-N phase locked loop (PLL) to the locking time.

A sigma delta modulator is commonly used in the fractional-N PLL. The sigma delta modulator generates a selection signal that is used to select the division ratio (divisor) of a divider of the frequency synthesizer. The division ratio (divisor) of the divider is randomly selected using the selection signal generated by the sigma delta modulator. If the division ratio of the divider is selected at regular intervals using the selection signal, frequency spurs can occur in an output spectrum. That is, the sigma delta modulator serves to select the division ratio of the divider and serves to shape noise.

The amount of area of a chip that is required by the sigma delta modulator is large, but this problem can be solved using a sigma delta modulator which generates a 1-bit selection signal.

Figure 1:
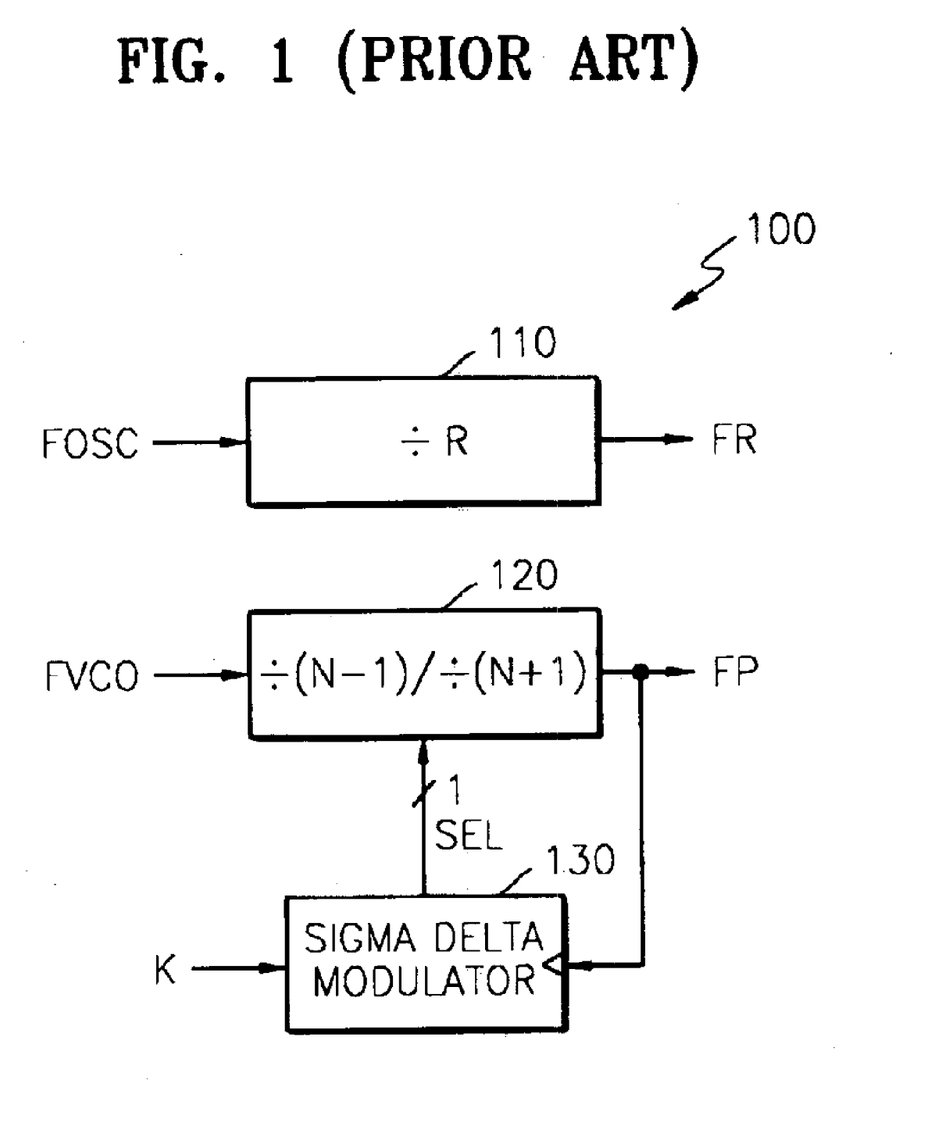
FIG. 1 is a block diagram illustrating the structure of a fractional-N frequency synthesizer.

FIG. 1 is a block diagram illustrating the structure of a fractional-N frequency synthesizer. Referring to FIG. 1, the fractional-N frequency synthesizer 100 includes a first divider 110 which receives and divides an oscillation frequency signal FOSC and generates a reference frequency signal FR, a second divider 120 which receives and divides a feedback frequency signal FVCO and generates a comparison frequency signal FP, and a sigma delta modulator 130.

A phase frequency detector which receives the reference frequency signal FR and the comparison frequency signal FP and compares the phase of the reference frequency signal FR with the phase of the comparison frequency signal FP, a charge pump, and a low pass filter are not shown.

The division ratio (divisor) of the first divider 110 is R. The division ratio (divisor) of the second divider 220 is selected as one of N−1 or N+1 in response to a selection signal SEL.

The sigma delta modulator 130 generates the selection signal SEL and randomly selects the division ratio of the second divider 120. The capacity of the sigma delta modulator 130 is marked by a partial modulus F. The partial modulus is a dimensionless quantity.

The sigma delta modulator 130 receives a predetermined value K and controls the selection signal SEL according to the value of K/F. An accumulator (not shown) is provided inside the sigma delta modulator 130. When the accumulator over-flows, that is, when the value of the inputted K reaches the value of the partial module F, the selection signal SEL selects the division ratio (divisor) of the second divider 120 to be N+1.

The second divider 120 divides the frequency of the input signal, FVCO, by an average value of (N+.f) in response to the selection signal SEL. Here, N represents an integer, and .f represents a decimal.

In the fractional-N frequency synthesizer 100 of FIG. 1, the feedback frequency signal FVCO is determined by the following equations:

Reference frequency signal FR=Oscillation frequency signal FOSC/R;

Comparison frequency signal FP=Feedback frequency signal FVCO/(N+.f).

Here, reference frequency signal FR=comparison frequency signal FP, and thus feedback frequency signal FVCO=reference frequency signal FR×(N+.f).

Thus, a desired feedback frequency signal FVCO can be made according to values of N and .f. Here, the feedback frequency signal FVCO is equal to an output frequency signal of the frequency synthesizer.

When the division ratios of the second divider 120 are N and N+1, a quantization level A is 1. The quantization level A represents a difference between the division ratios N+1 and N.

When the quantization level A is 1, the value of K inputted to the sigma delta modulator 130 cannot exceed about 80% of the value of the partial module F. This problem causes the output range of the output frequency signal to correspond to about 80% of a desired output range.

For example, when the output range of the desired output frequency signal is between 100 and 101 and the quantization level A is 1, the comparison frequency signal FP can be outputted within the range between 100.1 and 100.9 and cannot be outputted within the range between 100 and 100.1 and between 100.9 and 101. This problem is referred to as a "dead band problem."

In order to solve the dead band problem, the division ratios of the second divider 120 are N−1 and N+1, as shown in FIG. 1. Then, the quantization level Δ is 2. Thus, the value of K inputted to the sigma delta modulator 130 when the quantization level Δ is 1. Therefore, the dead band problem of the output frequency signal is solved.

However, since the quantization level Δ is 2, a quantization noise power increases.

The quantization noise power may be expressed by Equation 1.

$$P=\Delta^2/(12 \times OSR) \qquad (1)$$

Here, P represents a quantization noise power, A represents a quantization level, and OSR represents an over sampling ratio.

As known from Equation 1, in order to reduce the quantization noise power, the quantization level should be reduced. Thus, a fractional-N frequency synthesizer which reduces the quantization noise power by setting the quantization level to 1 and generates an output frequency signal of a desired overall range is necessary.

To solve the above and other problems, it would be desirable to provide a fractional-N frequency synthesizer which exhibits reduced quantization noise power and generates an output frequency signal of a desired overall range.

It would also be desirable to provide a method for generating a frequency which exhibits reduced quantization noise power and generates an output frequency signal of a desired overall range.

Accordingly, in one aspect of the present invention, there is provided a frequency synthesizer, including a first divider, a second divider, and a division ratio (divisor) controller. The first divider receives and divides an oscillation frequency signal. The second divider receives a predetermined feedback frequency signal and divides the feedback frequency signal in response to a selection signal.

The division ratio controller receives and divides an output signal of the first divider and an output signal of the second divider and generates a reference frequency signal in which the oscillation frequency signal is divided, a comparison frequency signal that is compared with the reference frequency signal, and the selection signal used to select the division ratio of the second divider.

Beneficially, the division ratio controller includes a third divider, an internal division ratio controller, a sigma delta modulator, and a synthesizer.

The third divider receives and divides the output of the first divider and generates the reference frequency signal. The internal division ratio controller receives the output of the second divider and generates a 1-bit first selection signal used to generate the comparison frequency signal and the selection signal.

The sigma delta modulator receives a predetermined value K that is externally controlled and generates a 1-bit second selection signal used to generate the selection signal, in response to the comparison frequency signal.

The synthesizer synthesizes the selection signal from the first and second selection signals.

More specifically, the internal division ratio controller includes a first internal divider, a second internal divider, and a modulus controller.

The first internal divider receives and divides the output signal of the second divider and generates the comparison frequency signal. The second internal divider receives and divides the output signal of the second divider.

The modulus controller receives the comparison frequency signal and the output signal of the second internal divider, outputs the first selection signal as a first level when the first and second internal dividers are simultaneously being counted, and outputs the first selection signal as a second level when only the first internal divider is being counted.

The third divider and the first internal divider have the same division ratio (divisors), and the first and second internal dividers have the same counting period, and a counting operation time of the second internal divider is shorter than that of the first internal divider.

The ratio of divisor for the second internal divider to the divisor of the first internal divider is greater than or equal to 0 and less than 1.

The second selection signal has the first or second level at irregular intervals. The size of an accumulator provided inside the sigma delta modulator is denoted by F, and the sum of a value K/F and the ratio of the divisor of the second divider to the divisor of first divider is greater than or equal to 0 and smaller than 1.

The selection signal is a 2-bit signal which selects various division ratios (divisors) of the second divider.

According to another aspect of the present invention, there is provided a frequency synthesizer including a first divider, a second divider, a division ratio (divisor) controller, and a sigma delta modulator.

The first divider receives and divides an oscillation frequency signal. The second divider receives a predetermined feedback frequency signal and divides the feedback frequency signal by various division ratios in response to a selection signal.

The division ratio controller receives and divides an output signal of the first divider and an output signal of the second divider and generates a reference frequency signal in which the oscillation frequency signal is divided, a comparison frequency signal that is compared with the reference frequency signal, and a first selection signal that is used to generate the selection signal used to select the division ratio of the second divider.

The sigma delta modulator receives a predetermined value K that is externally controlled and generates a second selection signal used to generate the selection signal, in response to the comparison frequency signal.

The division ratio controller includes a third divider and an internal division ratio (divisor) controller.

The third divider receives and divides the output of the first divider and generates the reference frequency signal. The internal division ratio controller receives the output of the second divider and generates the comparison frequency signal and the first selection signal used to generate the selection signal.

More specifically, the internal division ratio controller includes a first internal divider, a second internal divider, and a modulus controller.

The first internal divider receives and divides the output signal of the second divider and generates the comparison frequency signal. The second internal divider receives and divides the output signal of the second divider.

The modulus controller receives the comparison frequency signal and the output signal of the second internal divider, outputs the first selection signal as a first level when the first and second internal dividers are simultaneously counted, and outputs the first selection signal as a second level when only the first internal divider is counted.

The first and second internal dividers have the same counting period, and a counting operation time of the second internal divider is shorter than that of the first internal divider.

The ratio of the divisor of the second internal divider to the divisor of the first internal divider is greater than or equal to 0 and less than 1.

The third divider and the first internal divider have the same division ratio (divisor), and the second selection signal has the first or second level at irregular intervals.

The selection signal is a 2-bit signal, each of the first and second selection signals is a 1-bit signal, the first and second selection signals are added together, thus generating the selection signal.

The size of an accumulator provided inside the sigma delta modulator is marked by F, and the sum of a value K/F and the ratio of the divisor of the second divider to the divisor of the first divider is greater than or equal to 0 and smaller than 1.

In yet another aspect of the invention, there is provided a method for generating an output frequency signal of a desired range while reducing a quantization noise power in a fractional-N frequency synthesizer having a sigma delta simulator. The method comprises: (a) dividing an oscillation frequency signal by R, dividing the R-divided oscillation frequency signal by D, and outputting a reference frequency signal; (b) receiving a predetermined feedback frequency signal and dividing the feedback frequency signal by various division ratios in response to a selection signal; (c) receiving and dividing the divided signal in (b), generating a comparison frequency signal that is compared with the reference frequency signal, and generating a 1-bit first selection signal used to generate the selection signal; (d) receiving a predetermined value K that is externally controlled and generating a 1-bit second selection signal used to generate the selection signal, in response to the comparison frequency signal; and (e) synthesizing the selection signal from the first and second selection signals and generating.

Step (c) comprises: (c1) dividing the divided signal in (b) by D, and generating the comparison frequency signal; (c2) dividing the divided signal in (b) by C; and (c3) receiving the comparison frequency signal and the output signal in (c2) and generating the first selection signal as a first or second level.

More specifically, in (c3), the comparison frequency signal and the output signal in (c2) are received, the first selection signal is outputted as the first level when (c1) and (c2) are simultaneously being performed, and the first selection signal is outputted as the second level when only (c1) is being performed.

A value C/D is greater than or equal to 0 and less than 1, and the second selection signal has the first or second level at irregular intervals. The selection signal is a 2-bit signal which selects various division ratios of (b).

BRIEF DESCRIPTION OF THE DRAWINGS

The above objects and advantages of the present invention will become more apparent by describing in detail preferred embodiments thereof with reference to the attached drawings in which.

DETAILED DESCRIPTION

The present invention will be described more fully hereinafter with reference to the accompanying drawings in which preferred embodiments of the invention are shown.

Hereinafter, the present invention will be described in detail by describing preferred embodiments of the invention with reference to the accompanying drawings. Like reference numerals refer to like elements throughout the drawings.

Figure 2:
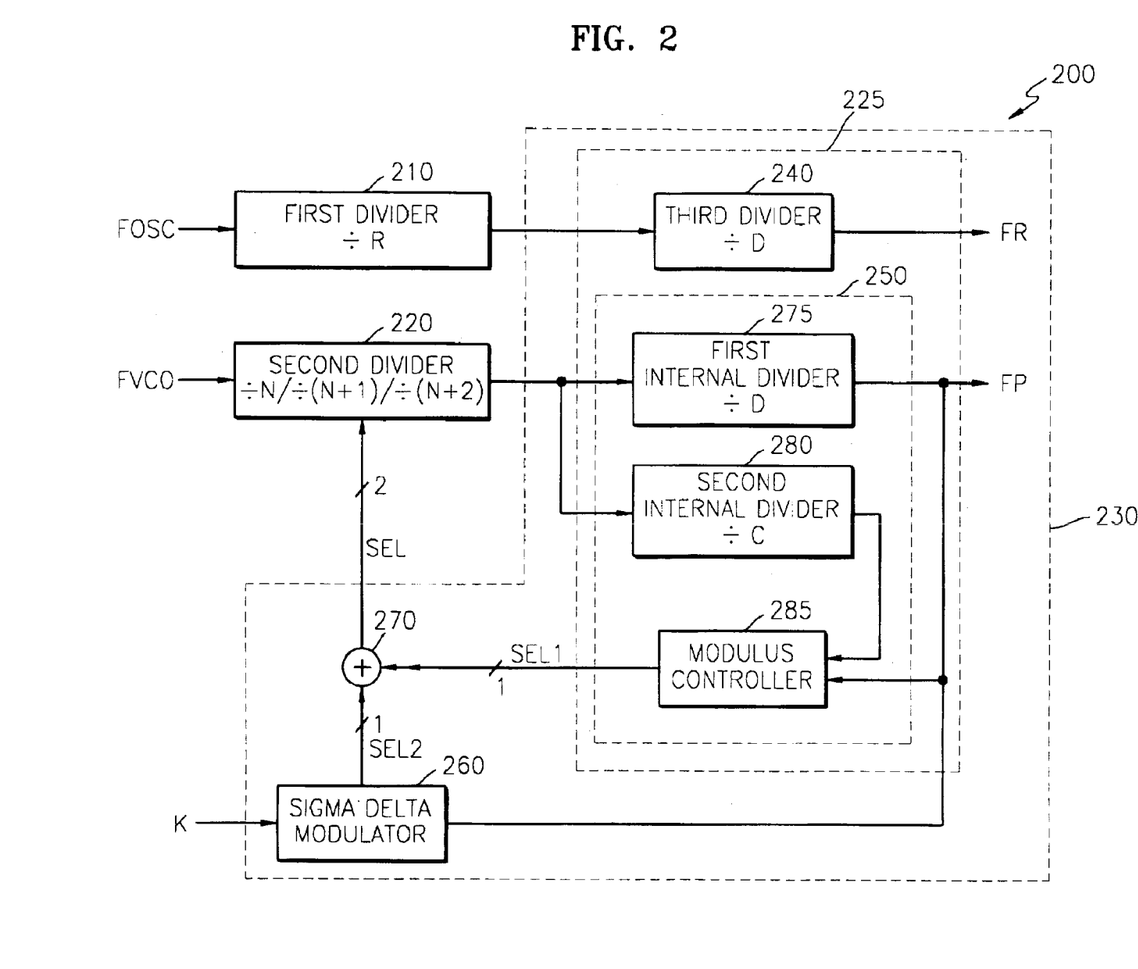
FIG. 2 is a block diagram illustrating the structure of one embodiment of a fractional-N frequency synthesizer.

FIG. 2 is a block diagram illustrating the structure of an embodiment of a fractional-N frequency synthesizer. Referring to FIG. 2, the fractional-N frequency synthesizer 200 includes a first divider 210, a second divider 220, and a division ratio (divisor) controller 230.

The first divider 210 receives and divides an oscillation frequency signal FOSC. The second divider 220 receives a predetermined feedback frequency signal FVCO and divides the feedback frequency signal FVCO by various division ratios (divisors) in response to a selection signal SEL.

The division ratio controller 230 receives and divides an output signal of the first divider 210 and an output signal of the second divider 220 and generates a reference frequency signal FR in which the oscillation frequency signal FOSC is divided, a comparison frequency signal FP that is compared with the reference frequency signal FR, and the selection signal SEL used to select the division ratios of the second divider 220.

The division ratio controller 230 includes a third divider 240, an internal division ratio (divisor) controller 250, a sigma delta modulator 260, and a synthesizer 270.

The third divider 240 receives and divides the output of the first divider 210 and generates the reference frequency signal FR. The internal division ratio controller 250 receives the output of the second divider 220, generates the comparison frequency signal FP and generates a 1-bit first selection signal SEL1 used to generate the selection signal SEL.

Preferably, the internal division ratio controller 250 includes a first internal divider 275, a second internal divider 280, and a modulus controller 285.

The first internal divider 275 receives and divides an output signal of the second divider 220 and generates the comparison frequency signal FP. The second internal divider 280 receives and divides the output signal of the second divider 220. Beneficially, the third divider 240 and the first internal divider 275 have the same division ratio (divisor). The first internal divider 275 and the second internal divider 280 have the same counting period, and the counting operation time of the second internal divider 280 is shorter than that of the first internal divider 275.

Also, the ratio of the divisor of the second internal divider 280 to the divisor of the first internal divider 275 is greater than or equal to 0 and less than 1.

The modulus controller 285 receives the comparison frequency signal FP and an output signal of the second internal divider 280. Also, the modulus controller 285 outputs the first selection signal SEL1 as a first level when the first internal divider 275 and the second internal divider 280 are simultaneously counted, and the modulus controller 285 outputs the first selection signal SEL1 as a second level when only the first internal divider 275 is counted.

The sigma delta modulator 260 receives a predetermined value K that is externally controlled and generates a 1-bit second selection signal SEL2 used to generate the selection signal SEL in response to the comparison frequency signal FP. The second selection signal SEL2 has a first or second level at irregular intervals.

The size of an accumulator inside the sigma delta modulator 260 is denoted by "F", and the sum of a value K/F and the ratio of the divisor of the second divider 220 to the divisor of the first divider 210 is greater than or equal to 0 and smaller than 1.

The synthesizer 270 generates the selection signal SEL from the first selection signal SEL1 and the second selection signal SEL2. The selection signal SEL is a 2-bit signal which selects various division ratios of the second divider 220.

Hereinafter, the operation of the fractional-N frequency synthesizer according to a first embodiment will be described in detail with reference to FIG. 2.

The first divider 210 receives the oscillation frequency signal FOSC and divides the oscillation frequency signal FOSC by R. R is a natural number. The second divider 220 receives the predetermined feedback frequency signal FVCO and divides the feedback frequency signal FVCO by various division ratios in response to the selection signal SEL. The feedback frequency signal FVCO is formed by feeding back an output frequency signal of the synthesizer 270.

The second divider 220 divides the feedback frequency signal FVCO by N, N+1, or N+2. The selection signal SEL is a 2-bit signal which selects one of the three division ratios of the second divider 220. The selection signal SEL will be described later.

The division ratio controller 230 receives and divides the output signal of the first divider 210 and the output signal of the second divider 220. Also, the division ratio controller 230 generates the reference frequency signal FR in which the oscillation frequency signal FOSC is divided, the comparison frequency signal FP that is compared with the reference frequency signal FR, and the selection signal SEL used to select the division ratio of the second divider 220.

The division ratio controller 230 includes the third divider 240, the internal division ratio controller 250, the signal delta modulator 260, and the synthesizer 270.

The third divider 240 receives and divides the output of the first divider 210 and generates the reference frequency signal FR. The third divider 240 has the same division ratio (divisor) as that of the first internal divider 275. The reference frequency signal FR has a frequency with which the comparison frequency signal FP is synchronized.

The internal division ratio controller 250 receives the output of the second divider 220 and generates the comparison frequency signal FP and the first partial selection signal SEL1 used to generate the selection signal SEL.

The internal division ratio controller 250 generates the first partial selection signal SEL1 so that the feedback frequency signal FVCO has a frequency that is a decimal number times the oscillation frequency signal FOSC. The first partial selection signal SEL1 generated by the internal division ratio controller 250 and the second partial selection signal SEL2 generated by the signal delta modulator 260 are used to generate the selection signal SEL that is used to select the division ratio of the second divider 220.

That is, the first partial selection signal SEL1 and the second partial selection signal SEL2 are added together by the synthesizer 270 to generate the selection signal SEL. The first partial selection signal SEL1 is a 1-bit signal which has the first and second levels at regular intervals. Here, the first level is a high level, and the second level is a low level. However, it is also possible that the first level is set to the low level and the second level is set to the high level.

The internal division ratio controller 250, which generates the first partial selection signal SEL1, includes the first internal divider 275, the second internal divider 280, and the modulus controller 285.

The first internal divider 275 receives the output signal of the second divider 220, divides the output signal of the second divider 220 by D, and generates the comparison frequency signal FP. D is a natural number. The second internal divider 280 receives the output signal of the second divider 220 and divides the output signal of the second divider 220 by C. C is a natural number.

C/D, which is the ratio of the divisor of the second internal divider 280 to the divisor of the first internal divider 275, is greater than or equal to 0 and less than 1. That is, D is greater than C.

Division by D means that D cycles of an input frequency signal are counted. The first and second internal dividers 275 and 280 have the same counting period. Thus, the first and second internal dividers 275 and 280 simultaneously start counting and are simultaneously reset. However, the counting operation time of the second internal divider 280 is shorter than that of the first internal divider 275.

That is, the first and second internal dividers 275 and 280 simultaneously start counting. The first and second internal dividers 275 and 280 simultaneously perform a counting operation; and then the second internal divider 280 first stops counting because D is greater than C. When counting of the first internal divider 275 stops, the first and second internal dividers 275 and 280 are simultaneously reset and restart counting.

The second internal divider 280 starts counting simultaneously with the first internal divider 275 then stops counting first, waits until the first internal divider 275 stops counting, and then is reset simultaneously with the first internal divider 275.

The modulus controller 285 receives the comparison frequency signal FP and the output signal of the second internal divider 280. Also, the modulus controller 285 outputs the first partial selection signal SEL1 as the first level, i.e., high level, when the first and second internal dividers 275 and 280 are simultaneously counted, and the modulus controller 285 outputs the first partial selection signal SEL1 as the second level, i.e., low level, when only the first internal divider 275 is counted.

Specifically, when the second internal divider 280 counts C and simultaneously the first internal divider 275 counts D, the first partial selection signal SEL1 is outputted as the high level. When the second internal divider 280 stops counting and only the first internal divider 275 counts D, the first selection signal SEL1 is outputted as the low level.

The sigma delta modulator 260 receives the predetermined value K that is externally controlled and generates the second partial selection signal SEL2 used to generate the selection signal SEL, in response to the comparison frequency signal FP.

An accumulator (not shown) is provided inside the sigma delta modulator 260, and the size of the accumulator is marked by a partial module F. The partial module is a dimensionless quantity.

The second partial selection signal SEL2 is a 1-bit signal, and is generated as a high or low level in response to the value K/F. Since the level of the value K inputted to the sigma delta modulator 260 is irregular, the second partial selection signal SEL2 has the high or low level at irregular intervals.

Beneficially, the sum of the value K/F and C/D, which is the ratio of the divisor of the second divider 220 to the divisor of the first divider 210, is greater than or equal to 0 and smaller than 1. For example, if C/D is 0.5, K/F is greater than 0 and smaller than 0.5. That is, if C/D is 0.5, the value K exists within 50% of the value F.

The synthesizer 270 generates the selection signal SEL from the first and second partial selection signals SEL1 and SEL2. The first partial selection signal SEL1 is generated as the high and low levels at regular intervals, and the second partial selection signal SEL2 is generated as the high and low levels at irregular intervals.

A process in which the division ratio of the second divider 220 is selected using the selection signal SEL will be described below by denoting the high level by "1" and the low level by "0".

If the first partial selection signal SEL1 is 1 and the second partial selection signal SEL2 is also 1, the selection signal SEL is 11. If the first partial selection signal SEL1 is 0 and the second partial selection signal SEL2 is 1, the selection signal is 01. If the first partial selection signal SEL1 is 1 and the second partial selection signal SEL2 is 0, the selection signal SEL is 10. If the first partial selection signal SEL1 is 0 and the second partial selection signal is 0, the selection signal SEL is 00.

If the selection signal SEL is 11, the division ratio of the second divider 220 is selected as N. If the selection signal SEL is 10 or 01, the division ratio of the second divider 220 is selected as N+1. If the selection signal SEL is 00, the division ratio of the second divider 220 is selected as N+2.

The division ratio of the fractional-N frequency synthesizer 200 having the above structure will be described by Equation 2.

$$FP = FVCO/[N \times (D-C) + C \times (N+1)] = FVCO/(N \times D + C)$$
$$FR = FOSC/(R \times D)$$
$$\therefore FVCO = FOSC \times (N \times D + C)/(R \times D) = FOSC \times (N + C/D)/R \quad (2)$$

As known from Equation 2, the feedback frequency signal FVCO may be expressed by (N+C/D)/R times of the oscillation frequency signal FOSC.

For example, if N=M+.f, R=1, D=2, and C=1, FVCO= FOSC×(M+.f+C/D).

Here, M is a natural number, and .f is a decimal, denoted by K/F, which is the ratio of the value K inputted to the sigma delta modulator 260 to the partial modulus F. That is, .f=K/F.

Since C/D is ½, if .f is between 0 and 0.5, the feedback frequency signal FVCO may be expressed by a decimal, times the oscillation frequency signal FOSC. Specifically, the fractional-N frequency synthesizer 200 can output an output frequency signal of a desired range even though the value K inputted to the sigma delta modulator 260 is within 50% of the value F. Thus, the fractional-N frequency synthesizer 200 can reduce a quantization noise power and can generate the output frequency signal of the desired range by setting the quantization level to 1.

In a conventional fractional-N frequency synthesizer, the value K is about 80% of the value F when the quantization level is 1, and thus the conventional fractional-N frequency synthesizer cannot generate the output frequency signal of the desired frequency range. Thus, if the quantization level is set to 2, the range of the value K is twice such that the output frequency signal of the desired frequency range is generated. However, in this case, the quantization noise power increases.

According to the fractional-N frequency synthesizer 200 of FIG. 2, the quantization noise power can be reduced and the output frequency signal of the desired frequency range can be generated by setting the quantization level to 1.

That is, the output frequency signal can be a decimal number times the oscillation frequency signal FOSC by setting the value C/D to a predetermined value between 0 and 1 and adjusting the value K/F, i.e., .f. The value C/D is not necessarily ½ but is greater than 0 and less than 1, for example, ⅓ and ¼. The output frequency signal can be a decimal number times the oscillation frequency signal FOSC by setting the sum of the value K/F and the value C/D to be greater than 0 and smaller than 1.

Figure 3:
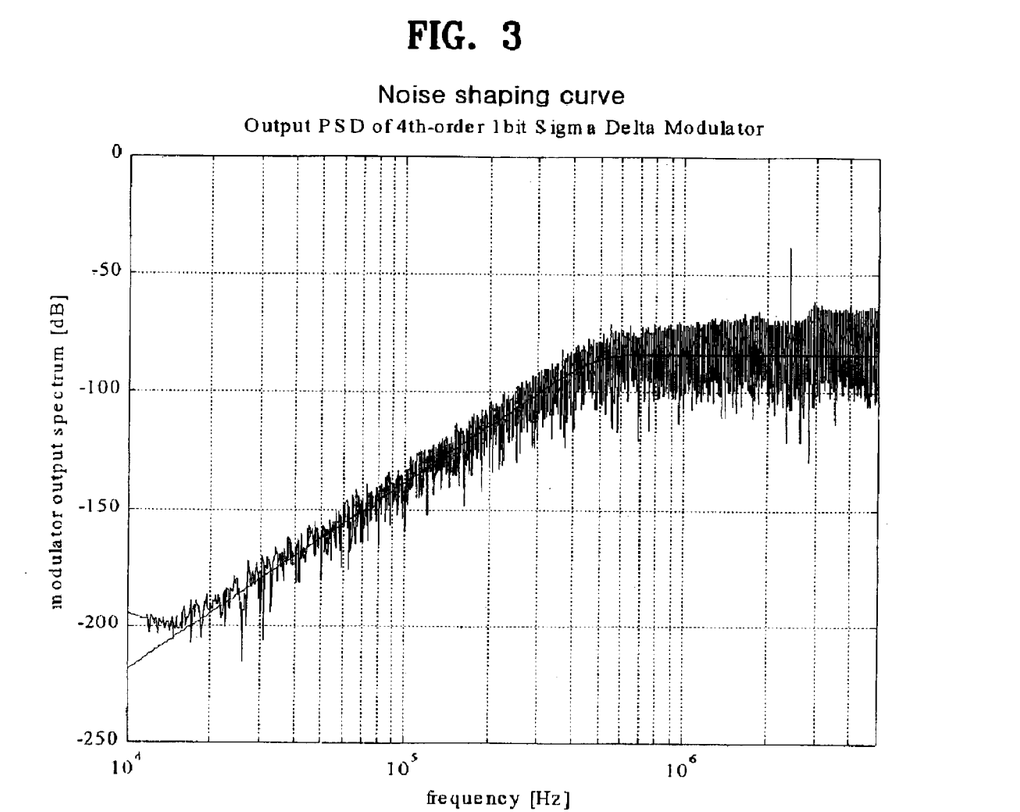
FIG. 3 illustrates an output spectrum of a sigma delta modulator of FIG. 2.

FIG. 3 illustrates an output spectrum of the sigma delta modulator of FIG. 2. FIG. 3 illustrates the case where the sigma delta modulator operates at 10 MHz. The noise shaping spectrum of FIG. 3 has the same shape as that of a conventional sigma delta modulator. However, since the quantization noise power is 1, the entire noise is reduced by about 6 dB compared to the case of a conventional device where the quantization noise power is 2.

Figure 4A:
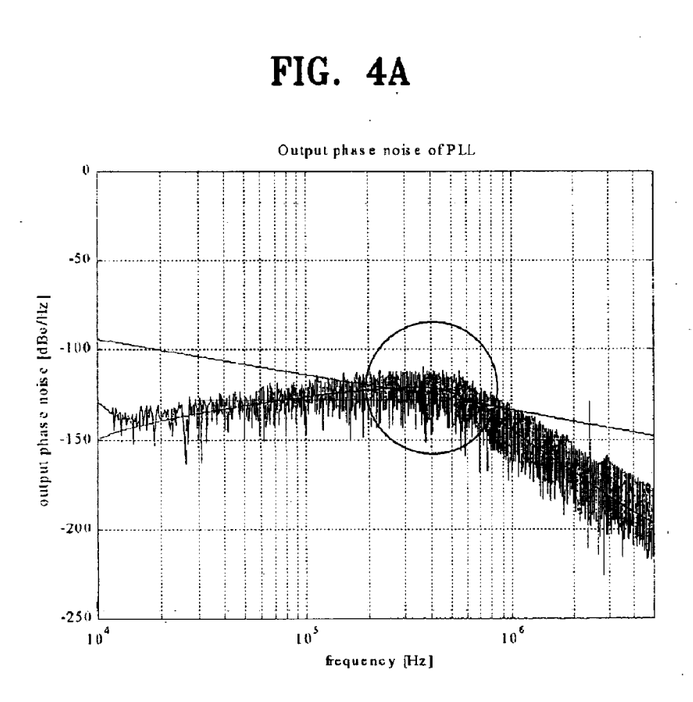
FIG. 4A illustrates a noise spectrum of a feedback frequency signal of the fractional-N frequency synthesizer of FIG. 1.

FIG. 4A illustrates the noise spectrum of a feedback frequency signal of the conventional fractional-N frequency synthesizer.

Figure 4B:
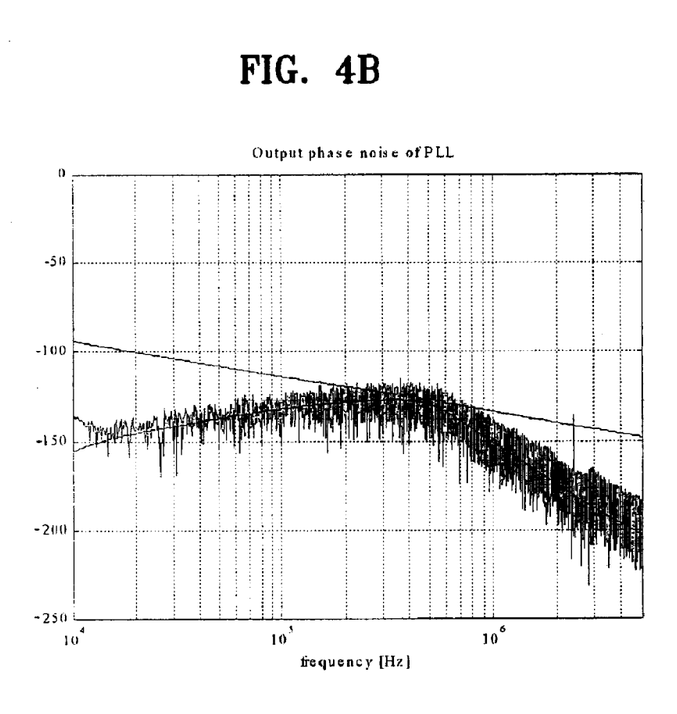
FIG. 4B illustrates a noise spectrum of a feedback frequency signal of the fractional-N frequency synthesizer of FIG. 2.

FIG. 4B illustrates a noise spectrum of a feedback frequency signal of the fractional-N frequency synthesizer according to FIG. 2.

A straight line having a negative slope shown in FIG. 4A represents the noise level of the feedback frequency signal. In FIG. 4A, the noise curve of the feedback frequency signal exceeds a straight line representing the noise level of the feedback frequency signal. This means that noise is large.

The noise curve of the feedback frequency signal of FIG. 2, shown in FIG. 4B, does not exceed a straight line representing the noise level of the feedback frequency signal. This means that noise is reduced, compared to that of FIG. 4A.

Figure 5:
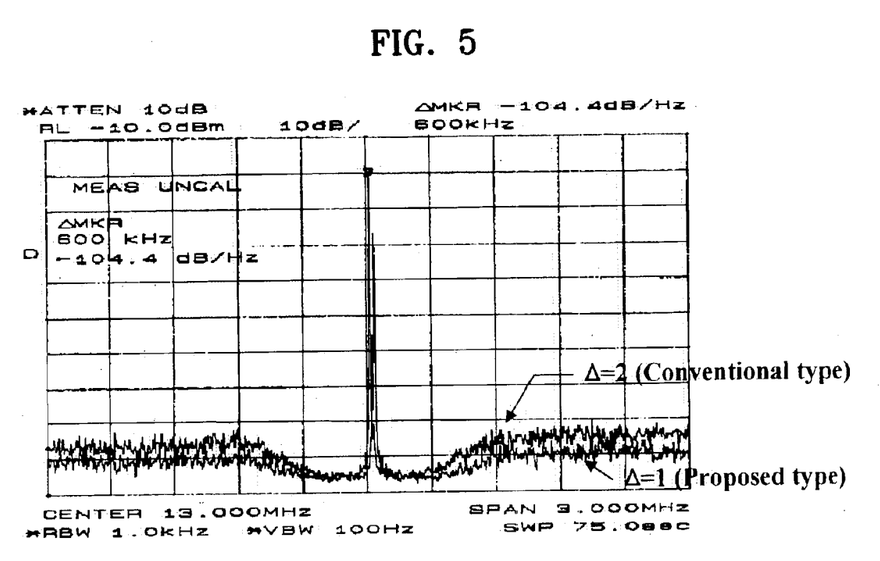
FIG. 5 illustrates an output spectrum of the sigma delta modulator having different quantization levels.

FIG. 5 illustrates an output spectrum of the sigma delta modulator having different quantization levels.

When the quantization level Δ is 1, noise is reduced by about 6 dB compared to the case where the quantization level Δ is 2.

FIG. 2 also illustrates a fractional-N frequency synthesizer according to a second embodiment.

A difference between the first embodiment and the second embodiment is that the division ratio controller 225 of the fractional-N frequency synthesizer 270 according to the second embodiment does not include the sigma delta modulator 260 and the synthesizer 270. However, the operation of the fractional-N frequency synthesizer according to the second embodiment is similar to that of the fractional-N frequency synthesizer 270 according to the first embodiment, and thus detailed descriptions thereof will be omitted.

Figure 6:
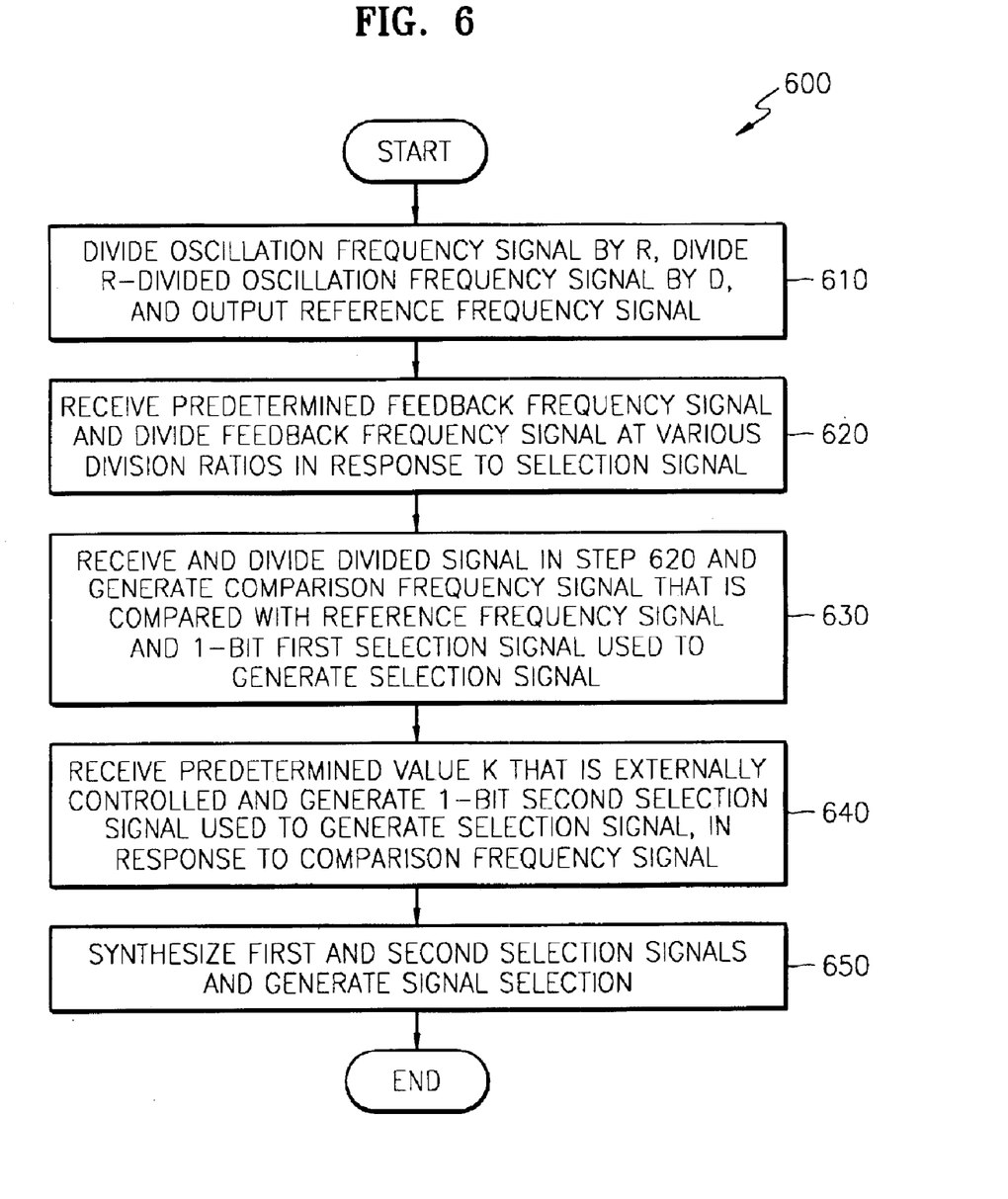
FIG. 6 is a flow chart illustrating a method for generating an output frequency signal of a desired range while reducing a quantization noise power.

FIG. 6 is a flow chart illustrating a method 600 for generating an output frequency signal of a desired range while reducing quantization noise power.

Figure 7:
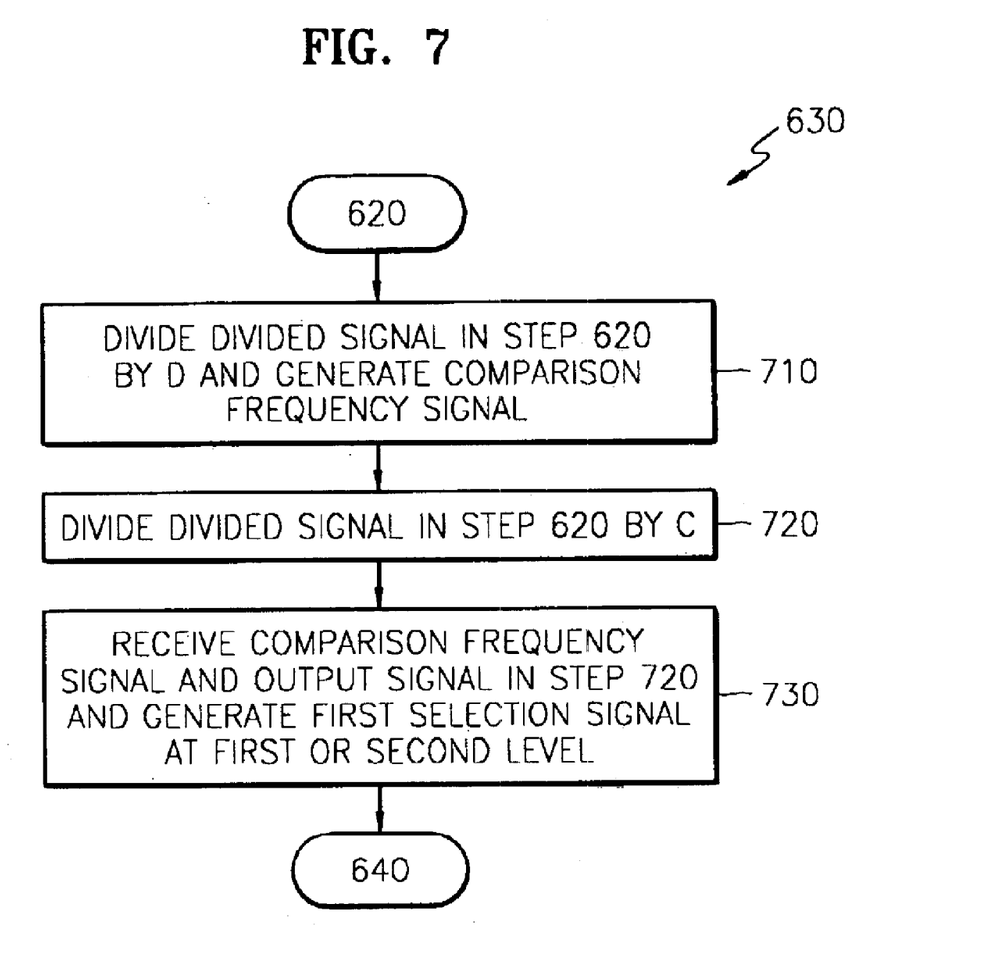
FIG. 7 is a flow chart specifically illustrating step 630 of FIG. 6.

FIG. 7 is a flow chart specifically illustrating step 630 of FIG. 6.

The method 600 for generating an output frequency signal of a desired range while reducing a quantization noise power is similar to the operation of the fractional-N frequency synthesizer 200 of FIG. 2.

In step 610, an oscillation frequency signal is divided by R, and the R-divided oscillation frequency signal is divided by D, and then a reference frequency signal is outputted. The oscillation frequency signal is a frequency signal generated by an oscillator (not shown) of a frequency synthesizer.

In step 620, a predetermined feedback frequency signal is received, and the feedback frequency signal is divided at various division ratios in response to a selection signal.

The feedback frequency signal is a frequency signal in which an output frequency signal of the frequency synthesizer is fed back. It is determined using the selection signal whether the feedback frequency signal is divided by N, N+1, or N+2. The selection signal is a 2-bit signal.

Beneficially, the selection signal is generated by first and second selection signals that are to be described later.

In step 630: the divided signal from step 620 is received and further divided; and a comparison frequency signal, that is compared to the reference frequency signal, and the 1-bit first selection signal used to generate the selection signal, are generated.

Step 630 will be described in greater detail now, with respect to FIG. 7.

In step 710, the divided signal from step 620 is divided by D, and the comparison frequency signal is generated. The comparison frequency signal is compared with the reference frequency signal and is synchronized with the reference frequency signal.

In step 720, the divided signal from step 620 is divided by C.

In step 730, the comparison frequency signal and the output signal from step 720 are received, and the first selection signal is generated as a first or second level. More specifically, in step 730, the comparison frequency signal and the signal, in which the divided signal from step 620 is divided by C, are received. When a D-division operation in step 710 and a C-division operation in step 720 are simultaneously being performed, the first selection signal is outputted as the first level. When only the D-division operation in step 710 is performed, the first selection signal is outputted as the second level.

Here, the first level is a high level, and the second level is a low level. However, it is also possible that the first level is set to the low level and the second level is set to the high level.

The D-division operation in step 710 and the C-division operation in step 720 have the same operation period. However, C/D is greater than or equal to 0 and less than 1.

Thus, even though the D-division operation in step 710 and the C-division operation in step 720 are simultaneously begun, the C-division operation ends first, and then the D-division operation is ended. Once the D-division operation ends, the C-division operation and the D-division operation simultaneously restart.

The first selection signal is controlled by the C-division operation time and the D-division operation time and thus has the high and low levels at regular intervals.

In step 640, a predetermined value K that is externally controlled is received, and a 1-bit second selection signal used to generate the selection signal is generated in response to the comparison frequency signal. An accumulator is provided inside a sigma delta modulator, and the size of the accumulator may be denoted by F.

The sigma delta modulator receives the predetermined value K and generates the second selection signal using the value K/F. The second selection signal has the first or second level at irregular intervals. These operations have already been described when the operation of the fractional-N frequency synthesizer 200 of FIG. 2 was described, and thus detailed descriptions thereof will be omitted.

In step 650, the selection signal is generated from the first and second 1-bit selection signals. The selection signal is a 2-bit signal which selects various division ratios in step 620. Since the 1-bit second selection signal has the high or low level at irregular intervals, the selection signal that is synthesized from the first selection signal and the 1-bit second selection signal also has the high or low level at irregular intervals.

The 1-bit first selection signal may be a 0 or 1, and the 1-bit second selection signal may be a 0 or 1. Thus, the selection signal may be a 2-bit signal such as one of 00, 01, 10, and 11. The various division ratios in step 620 are selected according to the logical value of the selection signal.

As described above, in the fractional-N frequency synthesizer and method for generating a frequency according to the present invention, the quantization noise power can be reduced, and the output frequency signal having the desired frequency range can be generated by setting the quantization level to 1.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A frequency synthesizer comprising:
   a first divider adapted to receive and divide an oscillation frequency signal;
   a second divider adapted to receive a feedback frequency signal and divide the feedback frequency signal in response to a selection signal; and
   a division ratio controller comprising:
   an internal division ratio controller adapted to receive an output signal of the second divider, to divide the output signal of the second divider by a first internal division ratio to generate a first internal divider output signal, to divide the output of the second divider by a second internal division ratio to generate a second internal divider output signal, and to compare the first and second internal divider output signals to generate a first partial selection signal used to generate the selection signal;
   a sigma delta modulator adapted to receive a predetermined value K that is externally controlled, and to generate a second partial selection signal, in response to the first internal divider output signal; and
   a synthesizer adapted to synthesize the first and second partial selection signals and to generate the selection signal.

2. The frequency synthesizer of claim 1, wherein the division ratio controller further comprises:
   a third divider adapted to receive and divide an output signal of the first divider and to generate a reference frequency signal, wherein
   the first partial selection signal is a first 1-bit selection signal, the second partial selection signal is a second 1-bit selection signal, and the first internal divider output signal is a comparison signal that is compared to the reference frequency signal.

3. The frequency synthesizer of claim 1, wherein the internal division ratio controller comprises:
   a first internal divider adapted to receive and divide the output signal of the second divider and to generate the first internal divider output signal;
   a second internal divider adapted to receive and divide the output signal of the second divider and to generate the second internal divider output signal; and
   a modulus controller adapted to receive the first internal divider output signal and the output signal of the second internal divider, to output the first partial selection signal as a first level when the first and second internal dividers are simultaneously being counted, and to output the first partial selection signal as a second level when only the first internal divider is being counted.

4. The frequency synthesizer of claim 3, wherein the division ratio controller further comprises a third divider adapted to receive and divide an output signal of the first divider to generate a reference frequency signal, and wherein the third divider and the first internal divider have a same division ratio.

5. The frequency synthesizer of claim 3, wherein the first and second internal dividers have the same counting period, and a counting operation time of the second internal divider is shorter than that of the first internal divider.

6. The frequency synthesizer of claim 3, wherein a ratio of a divisor of the second internal divider to a divisor of the first internal divider is greater than or equal to 0 and less than 1.

7. The frequency synthesizer of claim 2, wherein the second 1-bit selection signal has the first or second level at irregular intervals.

8. The frequency synthesizer of claim 1, wherein the size of an accumulator provided inside the sigma delta modulator is denoted by F, and the sum of a value K/F and a ratio of a divisor of the second divider to a divisor of the first divider is greater than or equal to 0 and smaller than 1.

9. The frequency synthesizer of claim 1, wherein the selection signal is a 2-bit signal which selects various division ratios of the second divider.

10. A frequency synthesizer comprising:
a first divider adapted to receive and divide an oscillation frequency signal;
a second divider adapted to receive a predetermined feedback frequency signal and to divide the feedback frequency signal at various division ratios in response to a selection signal;
a division ratio controller including,
an internal division ratio controller adapted to receive and divide an output signal of the second divider by a first internal division ratio to generate a comparison frequency signal, and to divide the output signal of the second divider by a second internal division ratio, and in response to dividing the output signal of the second divider by the first and second internal division ratios to generate a first partial selection signal used to generate the selection signal used to select the division ratio of the second divider, and
a sigma delta modulator adapted to receive a predetermined value K that is externally controlled and to generate a second partial selection signal used to generate the selection signal, in response to the comparison frequency signal.

11. The frequency synthesizer of claim 10, wherein the division ratio controller further comprises a third divider adapted to receive and divide the output of the first divider and to generate a reference frequency signal.

12. The frequency synthesizer of claim 11, wherein the internal division ratio controller comprises:
a first internal divider adapted to receive and divide the output signal of the second divider and to generate the comparison frequency signal;
a second internal divider adapted to receive and divide the output signal of the second divider; and
a modulus controller adapted to receive the comparison frequency signal and the output signal of the second internal divider, to output the first partial selection signal as a first level when the first and second internal dividers are simultaneously being counted, and to output the first partial selection signal as a second level when only the first internal divider is counted.

13. The frequency synthesizer of claim 12, wherein the first and second internal dividers have the same counting period, and a counting operation time of the second internal divider is shorter than that of the first internal divider.

14. The frequency synthesizer of claim 12, wherein a ratio of a divisor of the second internal divider to a divisor of the first internal divider is greater than or equal to 0 and less than 1.

15. The frequency synthesizer of claim 12, wherein the third divider and the first internal divider have the same division ratio.

16. A frequency synthesizer comprising:
a first divider adapted to receive and divide an oscillation frequency signal;
a second divider adapted to receive a predetermined feedback frequency signal and to divide the feedback frequency signal at various division ratios in response to a selection signal;
a division ratio controller adapted to receive and divide an output signal of the first divider and an output signal of the second divider and to generate a reference frequency signal in which the oscillation frequency signal is divided, a comparison frequency signal that is compared with the reference frequency signal, and a first partial selection signal that is used to generate the selection signal used to select the division ratio of the second divider; and
a sigma delta modulator adapted to receive a predetermined value K that is externally controlled and to generate a second partial selection signal used to generate the selection signal, in response to the comparison frequency signal,
wherein the second partial selection signal has the first or second level at irregular intervals.

17. A frequency synthesizer comprising:
a first divider adapted to receive and divide an oscillation frequency signal;
a second divider adapted to receive a predetermined feedback frequency signal and to divide the feedback frequency signal at various division ratios in response to a selection signal;
a division ratio controller adapted to receive and divide an output signal of the first divider and an output signal of the second divider and to generate a reference frequency signal in which the oscillation frequency signal is divided, a comparison frequency signal that is compared with the reference frequency signal, and a first partial selection signal that is used to generate the selection signal used to select the division ratio of the second divider; and
a sigma delta modulator adapted to receive a predetermined value K that is externally controlled and to generate a second partial selection signal used to generate the selection signal, in response to the comparison frequency signal,
wherein the selection signal is a 2-bit signal, each of the first and second partial selection signals is a 1-bit signal, the first and second partial selection signals are added together, thus generating the selection signal.

18. A frequency synthesizer comprising:
a first divider adapted to receive and divide an oscillation frequency signal;
a second divider adapted to receive a predetermined feedback frequency signal and to divide the feedback frequency signal at various division ratios in response to a selection signal;
a division ratio controller adapted to receive and divide an output signal of the first divider and an output signal of the second divider and to generate a reference frequency signal in which the oscillation frequency signal is divided, a comparison frequency signal that is compared with the reference frequency signal, and a first partial selection signal that is used to generate the selection signal used to select the division ratio of the second divider; and
a sigma delta modulator adapted to receive a predetermined value K that is externally controlled and to generate a second partial selection signal used to generate the selection signal, in response to the comparison frequency signal, wherein the sigma delta modulator includes an accumulator having a size denoted by "F," and wherein the sum of a value K/F and a ratio of a divisor of the second divider to a divisor of the first divider is greater than or equal to 0 and smaller than 1.

19. A method for generating an output frequency signal of a desired range in a fractional-N frequency synthesizer having a sigma delta simulator, the method comprising:

(a) dividing an oscillation frequency signal by R, dividing the R-divided oscillation frequency signal by D, and outputting a reference frequency signal;

(b) receiving a feedback frequency signal and dividing the feedback frequency signal at various division ratios in response to a selection signal;

(c) receiving and dividing the divided signal from (b) by D and generating a comparison frequency signal that is compared with the reference frequency signal;

(d) dividing the divided signal from (b) by C;

(e) receiving the comparison frequency signal and an output signal from (d) and in response thereto generating a first partial selection signal used to generate the selection signal;

(f) receiving a value K that is externally controlled and generating a second partial selection signal used to generate the selection signal, in response to the comparison frequency signal; and (g) generating the selection signal from the first and second partial selection signals.

20. The method of claim 19, wherein the first and second partial selection signals are each 1-bit selection signals.

21. The method of claim 20, wherein in (e) the first 1-bit selection signal is outputted as a first level when (c) and (d) are simultaneously being performed, and the first 1-bit selection signal is outputted as a second level when only (c) is being performed.

22. The method of claim 19, wherein a value C/D is greater than or equal to 0 and less than 1.

23. A method for generating an output frequency signal of a desired range in a fractional-N frequency synthesizer having a sigma delta simulator, the method comprising:

(a) dividing an oscillation frequency signal by R, dividing the R-divided oscillation frequency signal by D, and outputting a reference frequency signal;

(b) receiving a feedback frequency signal and dividing the feedback frequency signal at various division ratios in response to a selection signal;

(c) receiving and dividing the divided signal from (b), generating a comparison frequency signal that is compared with the reference frequency signal, and generating a first 1-bit selection signal used to generate the selection signal;

(d) receiving a value K that is externally controlled and generating a second 1-bit selection signal used to generate the selection signal, in response to the comparison frequency signal; and (e) the selection signal generating from the first and second 1-bit selection signals, wherein the second 1-bit selection signal has the first or second level at irregular intervals.

24. A method for generating an output frequency signal of a desired range in a fractional-N frequency synthesizer having a sigma delta simulator, the method comprising:

(a) dividing an oscillation frequency signal by R, dividing the R-divided oscillation frequency signal by D, and outputting a reference frequency signal;

(b) receiving a feedback frequency signal and dividing the feedback frequency signal at various division ratios in response to a selection signal;

(c) receiving and dividing the divided signal from (b), generating a comparison frequency signal that is compared with the reference frequency signal, and generating a first 1-bit selection signal used to generate the selection signal;

(d) receiving a value K that is externally controlled and generating a second 1-bit selection signal used to generate the selection signal, in response to the comparison frequency signal; and (e) the selection signal generating from the first and second 1-bit selection signals, wherein the selection signal is a 2-bit signal which selects the various division ratios of (b).

* * * * *